United States Patent [19]

Berenz et al.

[11] Patent Number: 4,951,099
[45] Date of Patent: Aug. 21, 1990

[54] OPPOSED GATE-SOURCE TRANSISTOR

[75] Inventors: John J. Berenz, Lawndale, Calif.; G. Conrad Dalman; Charles A. Lee, both of Ithaca, N.Y.

[73] Assignee: TRW Inc., Redondo Beach, Calif.

[21] Appl. No.: 144,452

[22] Filed: Jan. 15, 1988

Related U.S. Application Data

[63] Continuation of Ser. No. 727,208, Apr. 29, 1985, abandoned, which is a continuation of Ser. No. 347,226, Feb. 19, 1982, abandoned.

[51] Int. Cl.$^5$ .................... H01L 29/80; H01L 27/12; H01L 29/06; H01L 23/02
[52] U.S. Cl. .......................................... 357/22; 357/4; 357/55; 357/81
[58] Field of Search ...................... 357/22 D, 22 E, 60

[56] References Cited

U.S. PATENT DOCUMENTS

| | | | |
|---|---|---|---|
| 4,141,021 | 2/1979 | Decker | 357/22 D |
| 4,236,166 | 11/1980 | Cho et al. | 357/60 |
| 4,249,190 | 2/1981 | Cho | 357/22 E |

OTHER PUBLICATIONS

A. Cho et al., "L-N H-P GaAs Microwave FET . . . Epitaxy," J.A.P. vol. 48#1, Jan. 1977, pp. 346-349.

Primary Examiner—Rolf Hille
Assistant Examiner—Wael Fahmy
Attorney, Agent, or Firm—James M. Steinberger; Ronald M. Taylor

[57] ABSTRACT

A field-effect transistor (FET) and a corresponding method for its fabrication, the transistor having a source and a gate located at opposite faces of an active channel region formed in a substrate, the source being substantially shorter in effective length than the gate and located symmetrically with respect to the gate. The transistor also has two drains, located one at each end of the channel region, and charge carriers flow from the source to the drains in two paths, under control of the same gate. Electrical contact with the source is made from beneath the substrate, while contact with the gate and drains is made from above. The resulting device has a large incremental transconductance and relatively small parasitic impedances, and therefore can operate at much higher frequencies than conventional FET's.

7 Claims, 4 Drawing Sheets

OPPOSED GATE-SOURCE TRANSISTOR

The Goverment has rights in this invention pursuant to Contract No. N00123-81-C-1225 awarded by the Department of the Navy.

This is a continuation of application Ser. No. 727,208 filed Apr. 29, 1985, which in turn is a continuation of application Ser. No. 347,226 filed Feb. 9, 1982 abandoned.

BACKGROUND OF THE INVENTION

This invention relates generally to field-effect transistors (FET's), and, more particularly, to field-effect transistors capable of operation at extremely high frequencies, as high as 300 gigahertz (GHz) or higher. Since the wavelength at these frequencies is one millimeter (mm) or less, such devices are occasionally referred to as milimeter-wave devices. High-frequency transistors of this type may be usefully incorporated into monolithic circuits, either digital or analog, operating at millimeter and shorter wavelengths. Discrete transistor devices of the same type may be employed as amplifiers and oscillators, as well as in mixers, frequency multipliers and so forth.

A field-effect transistor (FET) is a three-terminal amplifying or switching semiconductor device in which charge carriers flow along an active channel region between a source terminal and a drain terminal. When a bias voltage is applied to a gate terminal adjacent to the channel, a carrier depletion region is formed in the channel and the current flow is correspondingly inhibited. In a conventional FET, the source and drain terminals make contact with source and drain semiconductor regions of the same conductivity type, and the active channel takes the form of a planar layer extending between the source and drain regions. The gate terminal makes contact with the channel at a point between the source and the drain, and usually on thge same face of the device as the source and drain terminals.

The performance of such a conventional FET at high frequencies is limited principally by the transconductance of the device, the source resistance, the source inductance, and by other circuit "parasitics", that is by internal impedances associated with the transistor. Various attempts have been made to design field-effect transistors that reduce parasitic impedances and thereby increase the frequency of operation. For example David R. Decker has proposed in his U.S. Pat. No. 4,141,021, that the gate and the source be positioned on opposite faces of the channel. If electrical contact is made with the source from the face opposite the gate, the inherent source resistance and inductance are significantly reduced. However, other parasitics are still present, and the incremental transconductance per unit width of the device is still relatively low.

Other prior patents have also suggested the use of a source located on the opposite face with respect to a gate. For example, U.S. Pat. No. 4,249,190 to Cho includes a floating gate between the source and gate. U.S. Pat. No. 4,129,879 to Tantraporn and U.S. Pat. No. 4,236,166 to Cho et al. have the source and drain on opposite faces and the gate buried between the faces in a position intermediate the source and drain. Finally, Nelson, in U.S. Pat. No. 2,985,805, suggests the use of a gate on the opposite face of the device with respect to the source and drain terminals.

However, all of the prior art devices are still limited in their performance at high frequencies by a relatively low incremental transconductance per unit width, and by the presence of significant parasitic impedences. The present invention overcomes these disadvantages.

SUMMARY OF THE INVENTION

The present invention resides in a field-effect transistor capable of operation at extremely high frequencies, and having a semiconductor channel region, and a source and gate located on opposite faces of the channel, the source being of an effective length substantially less than that of the gate and being located substantially symmetrically with respect to the gate. Two separate drains are located at opposite ends of the channel region, and current flows in two parallel paths from the source to the two drains. The device is therefore equivalent to two parallel FET's. In this parallel configuration, the incremental transconductance of the device per unit width is approximately twice that of a single conventional FET of similar design. Since the transconductance is a significant parameter limiting high frequency performance of FET's, the device of the invention can achieve a much higher frequency of operation than conventional FET's.

In a preferred form of the invention, the source is formed as a buried semiconductor region of a selected conductivity type within a non-conductive or semi-insulating substrate. The channel region is formed over the semi-insulating substrate, then drain regions of the same conductivity type as the source are formed at the ends of the channel, and gate and drain metal is deposited on the upper face of the device. Contact with the source region is made by forming an opening in the substrate on the opposite face with respect to the gates and drains. A metalized layer making contact with the source also forms a ground plane. With this arrangement, the source resistance and inductance are practically eliminated, thereby contributing significantly to the high frequency performance of the device.

Another important advantage of the invention is that, with the source connected to a ground plane on the opposite face of the device with respect to the gate and drain inputs, the gate and drains function to carry input and output signals in the manner of microstrip transmission lines. With appropriate impedance termination of the gate and drains, the device can operate in a distributed interaction mode wherein the interaction between gate and drain may be viewed as taking place in a uniformly distributed manner along the width of the device. This aspect of the invention also facilitates the significant reduction of parasitic impedances of input and output connections, and the design of matching microstrip stuctures for input and output connections.

Use of a single gate and two drains in the same device achieves effective gate lengths of less than a micron, although the phyical gate length may be in fact more than a micron. The effective gate length is less than the physical gate length by the effective length of the source region, which "shadows" part of the gate and reduces its effective length. This factor is important because the fabication of devices by photolithgraphic means is limited to about a one micron resolution.

In general terms, the novel structure of the invention comprises a non-conductive substrate having first and second faces, a source region formed in the substrate beneath the first face, an active channel region formed adjacent to the substrate and in contact with the source region, two drain regions formed at opposite ends of the channel region, a gate strip formed on the active channel region opposite the source regions, and having an effective length substantially greater than the effective length of the source region, drain metal strips formed on the respective drain regions, and means for contacting the source region from the second face of the substrate.

In accordance with a presently preferred method of fabricating the device, the substrate is a relatively deep semi-insulating layer of gallium arsenide (GaAs), and the source is selectively ion implanted in the upper face of the substrate, and then annealed. An additional layer of semi-insulating material, such as gallium arsenide or gallium aluminum arsenide is then grown over the substrate and the implanted source. Next, a small well is etched into the additional layer of semi-insulating material, to expose an active region of the source. An n-type channel region is then grown over the entire structure including the upper semi-insulating layer and the source. Using a conventional photoresist process, drain regions are exposed in the channel and are ion implanted to form n+ regions for the two drains at opposite ends of the channel. Aluminum or another metal is deposited over the entire surface of the device and then selectively patterned by etching through a photoresist layer to define a gate metal layer. Metal is also applied to the drain regions in a conventional fashion and finally the source region is contacted by opening a window in the semi-insulating layer from the bottom of the substrate and depositing metal over the entire bottom layer, to form a ground plane connected with the source.

The device of the invention may also be incorporated into parallel structures including multiple gates and multiple pairs of drains on the same substrate. A common ground plane is then used to contact multiple sources buried in the substrate.

It will be appriciated from the foregoing that the present invention represents a significant advance in field effect transistors, especially those intended for operation at extremely high frequencies. In particular, the invention provides a field-effect transistor with two drains and a gate located at one face of the active channel and a source located symmetrically at the other face of the channel, the source being significantly shorter in length than the gate. This symmetrical structure not only reduces the parasitic impedances associated with the device, but also effectively doubles the incremental transcouductance, resulting in the ability to operate at much higher frequencies than conventional or other FET's. Another benefit of having two widely separated drains is an improvement in heat dissipation from the device. Other aspects and advantages of the invention will become apparent from the following more detailed description, taken in conjunction with the accompanying drawings.

DESCRIPTION OF THE PREFERRED EMBODIMENT

Figure 1A:
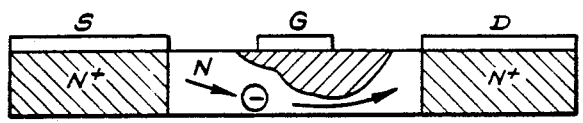
FIG. 1a is a diagrammatical cross-sectional view illustrating the operation of a conventional FET.

As shown in the drawings for purposes of illustration, the present invention is principally concerned with field-effect transistors, and in particular with field-effect transistors suitable for operation at extremely high frequencies. Two significant limitations in the highest frequency obtainable in FET's are the presence of parasitic inpedences associated with the device, and the incremental transconductance of the device. Another limiting factor is that the attainment of very high frequencies requires the use of sub-micron gate lengths, which may be beyond the resolution obtainable in conventional photolithographic fabrication processes.

FIG. 1a shows a conventional FET having an active n-type channel region 10, an n+ source region 12 at one end of the channel, an n+ drain region 14 at the other end of the channel, source and drain terminals 16 and 18, respectively contacting the source and drain regions 12 and 14, and a gate 20 contacting the channel between the source and the drain. In the conventional FET, a bias voltage is applied to the gate 20 and produces carrier depletion region, indicated at 22, in the channel 10. Charge carriers, indicated at 24, are forced to traverse a narrower or "pinched off" region of the channel 10 in the vicinity of the gate 20 as they pass from the source 12 to the drain 14. Appropriate selection of the circuit parameters of the device allows it to be used either as a switch in digital applications, or as an amplifier in analog applications. The maximum frequency of oscillation of the conventional FET is limited principally by the presence of significant parasitic circuit impendance as well as by a relatively low value of incremental transconductance.

The incremental transconductance, usually designated by the symbol $g_m$, is a circuit parameter representing the relationship between an incremental change in gate bias voltage and the corresponding incremental change in drain current. The incremental transconductance may sometimes be expressed as a value (in mhos or siemens) per unit width of the gate.

Figure 1B:
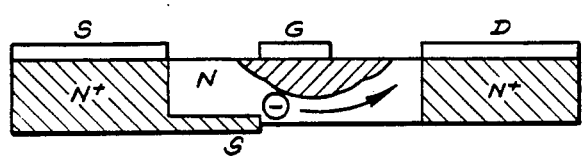
FIG. 1b is a view similar to FIG. 1a but showing the source region modified to extend slightly beneath the gate.

A slight improvement over conventional FET performance is provided by the version shown in FIG. 1b, in which the source region 12 extends slightly beneath the gate, as shown at 12a. This provides for a reduced source-gate resistance and also reduces the effective length of the gate, to the extent that the source extends beneath the gate. Since the gate length is a significant factor in the determination of the maximum frequency of oscillation, any reduction in the gate length contributes to the high-frequency performance of the device.

Figure 1C:
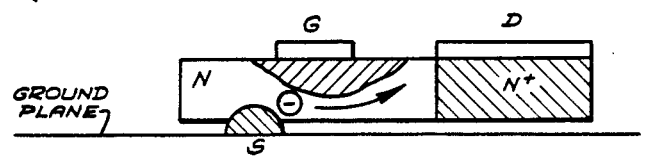
FIG. 1c is a view similar to FIGS. 1a and 1b but showing a further development in which the source region is located beneath and slightly overlapping the gate.

FIG. 1c is a further development, in which a source region 12' is located entirely on the opposite face of the channel 10 with respect to the gate 20 and drain 18. This further improves performance by reducing the source inductance, since connection is made to the source through a ground plane 25 located on the lower face of the device.

Before discussing more specific aspects of the transistor structure, a few definitions are needed. First, the term "length" refers to a dimension measured essentially in the direction of current flow in the device. "Width" is measured at right-angles to the length and is a direction normal to the paper in the cross-sectional views such as FIGS. 1a–1d and 4a–4f. The "width" of the device is typically larger than its "length." Secondly, the terms "above," "below," "upper," "lower," and so forth are used only for convenience in distinguishing one face of the transistor from another. It will be understood that the invention functions equally well in any orientation.

Figure 1D:
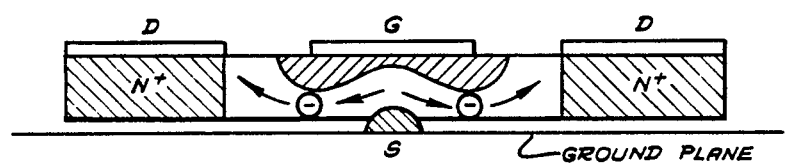
FIG. 1d is a diagrammatical cross-sectional view of the opposed gate-source transistor of the present invention.

In accordance with the inventin and as shown in FIG. 1d, a field-effect transistor is provided with an active channel region 30, a gate 32 located at the upper face of the channel, and a source 34 having an effective length considerably shorter than that of the gate, and positioned symmetrically beneath the gate on the opposite face of the channel. Two drain regions 36 and 38 are located at opposite ends of the channel 30, with two corresponding drain connections 40 and 42 being made to the top of the respective drain regions. Since the device of the invention functions in some respects like two FET's connected in parallel, the incremental transconductance per unit width of the device is approximately double that of the device shown in FIG. 1c. In addition, the effective length of the gate 32 is only about half of its physical length. Accordingly, the device is easier to fabricate using conventional photolithographic methods. Stated another way, this means that the device when scaled down to the limits of photolithographic resolution will have a shorter effective gate length, and hence a better performance at high frequencies, than a conventional FET similarly scaled down.

Figure 2:
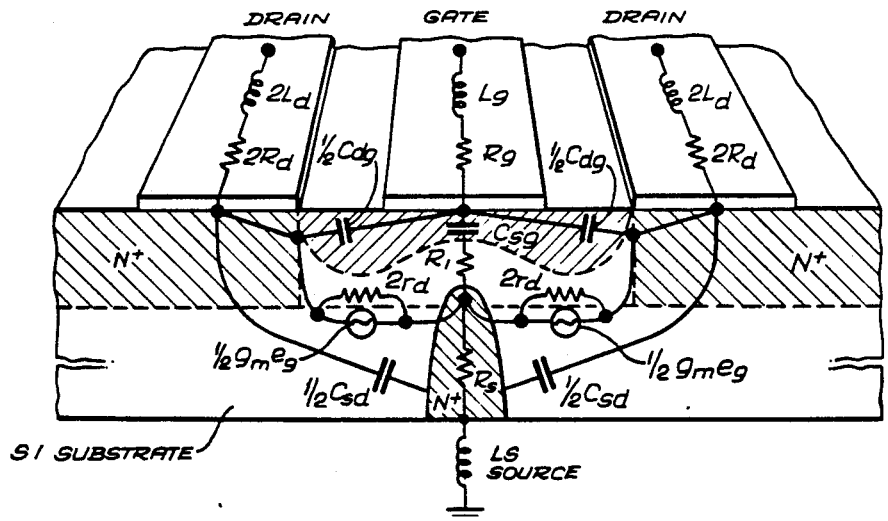
FIG. 2 is a diagrammatical perspective view of the transistor device of the invention, overlaid with its equivalent circuit.
Figure 3:
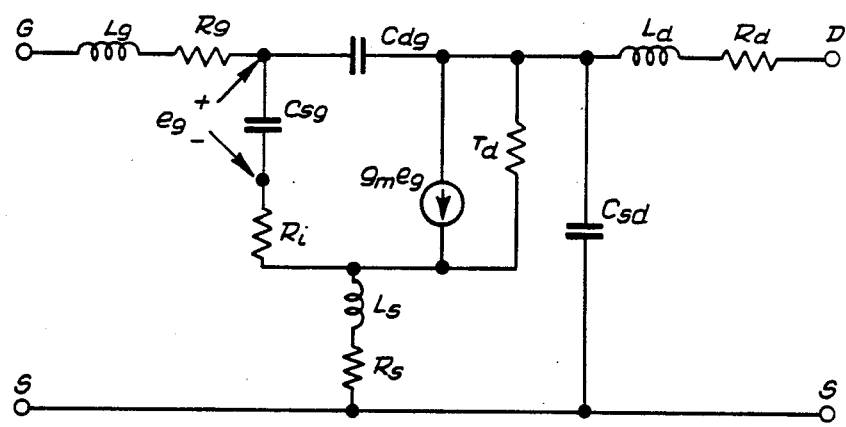
FIG. 3 is the equivalent circuit of the device of the invention.

FIG. 2 is a diagrammatical perspective view of the device. It will be appriciated from the further description below that the gate and channel regions are not shown to scale in this view. FIG. 3 shows the overall equivalent circuit of the device, and it will be noted that the equivalent circuit is also incorporated into FIG. 2 to show how the various components of the FIG. 3 equivalent circuit are distributed between the parallel pair of current paths from the source to the drains. It will be useful to discuss some of the circuit component values in FIG. 2, especially in relation to high frequency performance.

Most importantly, the overall incremental transconductance $g_m$ is twice the transconductance for each parallel path of the device, as indicated in FIG. 2. The maximum frequency of oscillation, which is defined as the frequency at which the power gain falls to unity, is approximately proportional to the square root of the transconductance. Therefore, a doubling of the transconductance raises the maximum frequency of oscillation by about forty percent.

In addition to the increase in transconductance, other equivalent circuit values are also significantly different in the device. First, because of the position of the source, the source-gate internal resistance $R_i$ will be considerably less than in a conventional FET. Also, the source inductance $L_s$ will be practically eliminated by use of the ground plane connection to the source. The source-gate capacitance $C_{sg}$ will not be significantly larger than in the conventional FET, provided the source length is a small fraction of the gate length. The source-drain capacitance $C_{SD}$ will also be relatively small if the source contact is isolated from the drains by a sufficiently thick semi-insulating layer. Another important change is that the gate resistance $R_g$ and inductance $L_g$ are minimized in the device, as a result of effectively paralleling two gates in the device itself, rather than employing two separate gates and connecting them electrically at a location external to the device.

To understand how various equivalent circuit parameters affect the maximum frequency of operation, it is necessary to consider some relevant mathematical relationships. First, the cut-off frequency $f_T$ of the device is defined as the frequency, for grounded-source operation, at which the current gain falls to unity, and is derived from the relationship:

$$f_T = v_{sat}/2\pi l_g,$$

where
$v_{sat}$ = the electron velocity within the device,
and $l_g$ = the gate length.

For a device designed to operate optimally at 60 GHz, the gate length is 0.15 micron ($10^{-6}$ meter), and the electron velocity can be approximated as $1 \times 10^7$ cm/sec. Therefore, $$f_T = 106 \text{ GHz (approx.)}$$

The approximate maximum frequency of oscillation $F_{max}$ is defined as the frequency at which the power gain of the device falls to unity, and is given by the expression:

$$f_{max} = \frac{f_T}{2} \left( \frac{g_m'}{g_{ds}} \right)^{\frac{1}{2}},$$

where
$g_{ds}$ = the drain-source conductance, and
$g_m'$ = the reduced transconductance.
$g_m'$ is given by:

$$g_m' = g_m/(1+g_m r_{sg}),$$

where
$g_m$ = the intrinsic incremental transconductance,
and $r_{sg}$ = the source-gate resistance.

It can be seen from these expressions that the value of $f_{max}$ will be increased if $g_m$ is raised, or if $r_{sg}$ is lowered, or if $l_g$ is lowered. The present invention provides a much increased transconductance $g_m$ and minimizes parasitic impendances, including $r_{sg}$. The invention also permits the gate length $l_g$ to be scaled down to a smaller dimension than in conventional FET's. Thus, the maximum frequency of operation is much higher in the device fabricated in accordance with the invention.

Still using the 60 GHz device as an example, $g_m$ can be estimated at 385 mS/mm (milliSiemens/millimeter). For channel doping concentration of $3 \times 10^{17}$ cm$^{-3}$, $g_{ds}$ is approximately 10 mS/mm, and $f_{max}$ is approximately 300 GHz.

The maximum power output for the device of the invention is limited both by the maximum allowable current density in the channel, and by the phenomenon of avalanche breakdown. The maximum power output for the 60 GHz device is approximately 4.5 milliwatts (mW), or 130 mW/mm. The following table summarizes the physical parameters of the 60 GHz device on which these calculations are based.

| | |
|---|---|
| Physical gate length $l_g$ | 0.30 microns |
| Source-drain spacing | 0.83 microns |
| Channel doping | $3 \times 10^{17}/cm^3$ |
| Channel thickness | 0.15 microns |
| Physical gate width | 33 microns |
| Pinch-off voltage $V_p$ | 4.9 v |
| Source-gate resistance $r_{sg}$ | 0.1 ohm-mm |
| Transconductance $g_m$ | 0.4 S/mm |
| Reduced transconductance $g_m'$ | 0.38 S/mm |
| Cutoff frequency | 106 GHz |
| Maximum frequency | 330 GHz |
| Drain-source current at saturation $I_{dss}$ | 5mA |
| Breakdown voltage $V_B$ | 8.5 v |
| Pinchoff voltage $V_p$ | 4.9 v |
| Threshold voltage $V_T$ for saturated current flow | 0.5 v |
| Height of gate Schottky barrier $\phi$ | 0.9 v |
| Maximum output power $P_O$* | 4.5 mW |

*Given by the expression:

$$P_O = \frac{2}{\pi^2} I_{dss}(V_B - V_P - V_T)\left(1 + \frac{\phi}{V_p}\right)^2$$

Figure 4A:
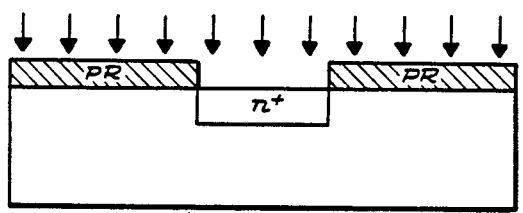
FIG. 4a-4f are together a sequence of cross-sectional views showing the principal steps in fabrication of the device of the invention.

Fabrication of the new device is shown by way of example of FIGS. 4a-4f. In FIG. 4a, a semi-insulating substrate of gallium arsenide, indicated by reference numberal 40 has the source region 34 selectively ion implanted in its upper surface, as indicated by the arrows 41. The ion implantation is performed using a photoresist layer 42 as a mask and exposing the area of the desired source region as a window 44 before the ion implantation step. The photoresist layer 42 is then removed and the n+ source region 34 is annealed.

Figure 4B:
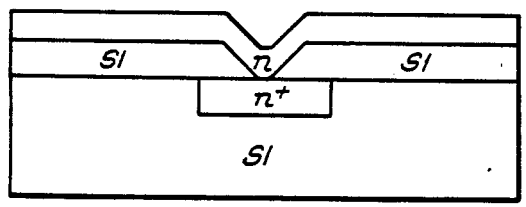

In subsequent steps, as shown in FIG. 4b, an additional semi-insulating layer 46 is grown epitaxially on the substrate 40 and initially extends across the source region 34. The new epitaxial layer 46 may, for example, by GaAs or gallium aliminum arsenide (GaAlAs). Next, a small well indicated by reference numeral 48, is etched into the layer 46 by conventional means, exposing a small active area 34a of the source region 34. The active n-type channel region 30 is then grown over the epitaxial layer 46 and over the active area 34a of the n+ source region 34.

Figure 4C:
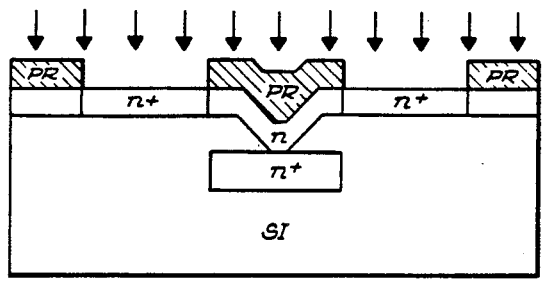
Figure 4D:
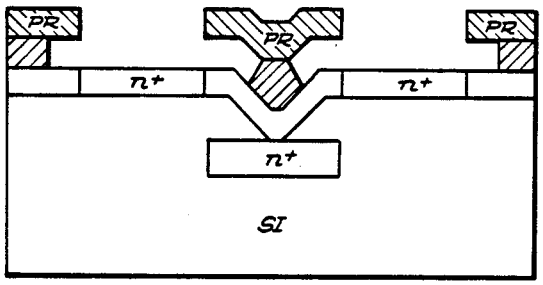
Figure 4E:
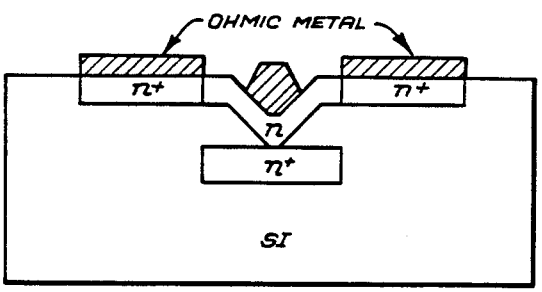
Figure 4F:
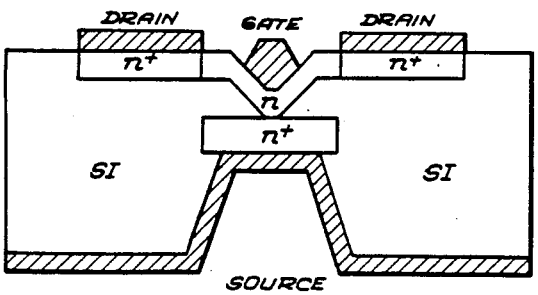

As shown in FIG. 4c, another photoresist layer 50 is employed to ion implant drain contact regions 36 and 38, which are also of the n+ type, in the channel 30, as indicated by the arrows 51. Next, aluminum gate metal is deposited over the entire surface and patterened by an appropriate photoresist layer 52. The gate metal is etched from under the photoresist 52 to provide a gate of the desired cross section, and leaving the openings in the photoresist to define the drain metal areas. As shown in FIG. 4e, ohmic metal, indicated at 54 is evaporated onto the n+ drain regions 36 and 38, and the remainder of the ohmic metal is removed in a conventional photoresist lift-off step. As shown in FIG. 4f, the final steps in the fabrication process are to form an opening 55 in the bottom surface of the semi-insulating substrate 40, for contact with the n+ source region 34. This step involves aligning the device to locate the opening 55 accurately beneath the source region 34. A presently preferred approach is to employ infrared radiation to locate the gate metal and therefore the source region below it. The last step in the fabrication process is the deposition of ground plane metal, indicated at 56 over the entire bottom surface of the device, covering the semi-insulating layer and making contact with the source region 34.

Figure 5:
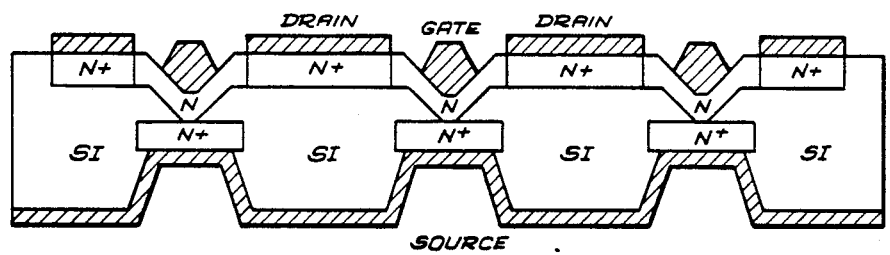
FIG. 5 is a diagrammatical cross-sectional view of a multiple-gate embodiment of the invention.
Figure 6:
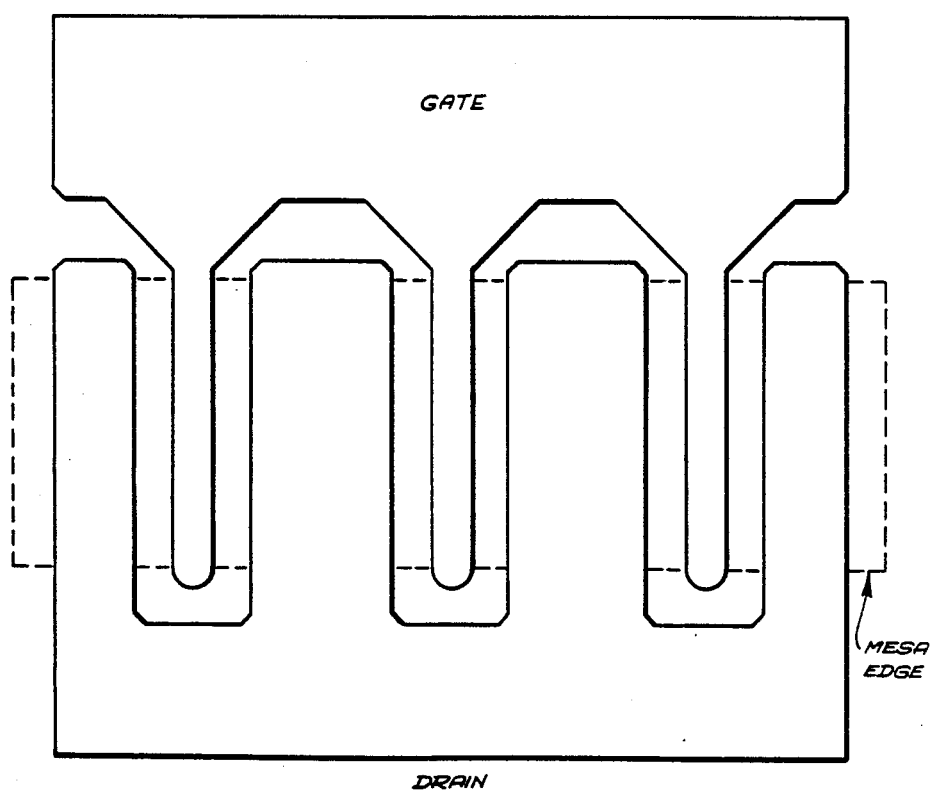
FIG. 6 is a diagrammatical plan view of the device shown in FIG. 5.

FIGS. 5 and 6 show a multiple gate device including three gates 32a, 32b and 32c and three corresponding source regions 34a, 34b and 34c. Such a device might be used to increase the total available power output. The device has four drain terminals 60–63 and four corresponding drain contact regions 64–67. Drain 64 receives current only from source 34a, drain 65 receives current both from source 34a and from source 34b, drain 66 receives current from source 34b and 34c and drain 67 receives current only from source 34c. The plan view of FIG. 6 shows that the gates 60–63 are connected to a common electrical terminal and likewise the drains 60–63 are also commonly electrically connected. Note, however, that the invention is not necessarily limited to this configuration, and that a "dual-drain" mode of operation may be appropriate in some applications, such as in the mixing or multiplying of signals.

It will be appreciated from the foregoing that the present invention represents a significant advance in the field of field effect transistors for use at extremely high frequencies. In particular, the device of the present invention provides a field-effect transistor with minimal circuit parasitic impedances and with a relatively large incremental transconductance.

Since the device uses a source connected to a ground plane on the opposite face of the device from the gate, it is extremely well suited for connection to high frequency circuitry, since the gate and drains function essentially as microstrip transmission lines. If the gate and drain are appropriately terminated, the device can operate optimally in a distributed interaction mode, in which the interaction between gate and drains may be viewed as taking place in a uniformly distributed manner along the width of the device. In the distributed interaction mode, parasitic impedances can be further reduced, and the design of matching input and output microstrip structures is facilitated.

Although a particular embodiment of the invention has been described in detail for purposes of illustration, various modifications may be made without departing from the spirit and scope of the invention. Accordingly, the invention is not to be limited except as by the appended claims.

We claim:

1. A field effect transistor capable of operation at extremely high frequencies, comprising:
   a substrate;
   an active channel region formed in the substrate;
   a gate located on one face of the channel;
   a source region located directly opposite the gate on the opposite face of the channel, the source region having a contact interface with the channel region that is shorter in length than the contact interface between the gate and the channel region; and
   two drain regions located at opposite ends of the channel;
   wherein current flows in two parallel paths from the source region to the drain regions, thereby increasing the incremental transconductance of the transistor, and wherein the effective length of the gate is reduced by the effective length of the source region that shadows the gate, thereby improving the high frequency performance of the transistor.

2. A field-effect transistor as set forth in claim 1, wherein:
said source region is connected to an electrically conductive ground plane sheet located adjacent said second face of said substrate.

3. The field effect transistor as set forth in claim 2, wherein:
the substrate material is semi-insulating gallium arsenide;
the channel region is n type gallium arsenide; and
the source and drain regions are n+ type gallium arsenide.

4. A field effect transistor capable of operation at extremely high frequencies, comprising:
a semi-insulating substrate;
a source region of semiconductor material of a selected conductivity type formed in the substrate;
an active channel region of semiconductor material formed over the substrate and in contact with the source region;
a metal gate formed over the channel region and directly above the source region, the gate having a contact interface with the channel region that is greater in length than the contact interface between the source region and the channel region; and
two drain regions of the same conductivity type as the source region formed at opposite ends of the channel region; and
a grounded metallic layer formed beneath the substrate and connected to the source region;
wherein current flows in two parallel paths from the source region to the drain regions, thereby increasing the incremental transconductance of the transistor, and wherein the effective length of the gate is reduced by the effective length of the source region that shadows the gate, thereby improving the high frequency performance of the transistor.

5. The field effect transistor as set forth in claim 4, wherein:
the substrate material is semi-insulating gallium arsenide;
the channel region is n type gallium arsenide; and
the source and drain regions are n+ type gallium arsenide.

6. A field effect transistor capable of operation at extremely high frequencies, the transistor being fabricated by the steps of:
ion implanting a source region of a selected conductivity type in a semi-insulating substrate;
epitaxially growing an active channel region over the substrate and in contact with the source region;
ion implanting two drain regions of the same conductivity type as the source region at opposite ends of the channel region;
depositing gate metal over the channel region directly above the source region;
selectively removing the gate metal of define a gate having a contact interface with the channel region that is greater in length than the contact interface between the source region and the channel region;
depositing ohmic metal over the drain contact regions;
forming an opening in the substrate from beneath to expose the source region; and
forming a metallic layer on the underside of the substrate to act as a ground plane to which the source region is connected;
wherein current flows in two parallel paths from the source region to the drain regions, thereby increasing the incremental transconductance of the transistor, and wherein the effective length of the gate is reduced by the effective length of the source region that shadows the gate, thereby improving the high frequency performance of the transistor.

7. The field effect transistor as set forth in claim 6, wherein:
the substrate material is semi-insulating gallium arsenide;
the channel region is n type gallium arsenide; and
the source and drain regions are n+ type gallium arsenide.

* * * * *